US009960059B2

(12) United States Patent
Lin et al.

(10) Patent No.: US 9,960,059 B2
(45) Date of Patent: May 1, 2018

(54) HONEYCOMB HEATERS FOR INTEGRATED CIRCUIT MANUFACTURING

(75) Inventors: Yi-Hung Lin, Taipei (TW); Jr-Hung Li, Chupei (TW); Chii-Horng Li, Zhubei (TW); Tze-Liang Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 597 days.

(21) Appl. No.: 13/436,263

(22) Filed: Mar. 30, 2012

(65) Prior Publication Data
US 2013/0256292 A1 Oct. 3, 2013

(51) Int. Cl.
H05B 3/06 (2006.01)
H01L 21/67 (2006.01)
H05B 3/00 (2006.01)

(52) U.S. Cl.
CPC ..... *H01L 21/67103* (2013.01); *H05B 3/0047* (2013.01)

(58) Field of Classification Search
CPC ......... H01L 21/67103; H01L 21/67115; H05B 3/0047; H05B 3/744; F27B 5/14; F27D 2099/0061
USPC ....... 219/411, 444.1; 392/411, 418; 118/725, 118/730, 666, 52
See application file for complete search history.

(56) References Cited

U.S. PATENT DOCUMENTS

| | | | | |
|---|---|---|---|---|
| 3,761,678 A | * | 9/1973 | Eckles | 392/411 |
| 3,854,443 A | * | 12/1974 | Baerg | 118/724 |
| 4,374,516 A | * | 2/1983 | Harrison | A61N 1/06 219/770 |
| 4,828,224 A | * | 5/1989 | Crabb et al. | 251/298 |
| 4,836,138 A | * | 6/1989 | Robinson et al. | 118/666 |
| 5,767,486 A | * | 6/1998 | Gronet et al. | 219/411 |
| 5,781,693 A | * | 7/1998 | Ballance et al. | 392/416 |
| 5,802,099 A | * | 9/1998 | Curran et al. | 374/131 |
| 5,889,258 A | * | 3/1999 | Lubomirski et al. | 219/405 |
| 5,937,142 A | * | 8/1999 | Moslehi et al. | 392/416 |
| 6,086,677 A | * | 7/2000 | Umotoy et al. | 118/715 |
| 6,090,210 A | * | 7/2000 | Ballance et al. | 118/725 |
| 6,114,662 A | * | 9/2000 | Guidotti et al. | 219/388 |
| RE36,957 E | * | 11/2000 | Brors et al. | 118/725 |
| 6,156,079 A | * | 12/2000 | Ho et al. | 29/25.01 |
| 6,167,195 A | * | 12/2000 | Moslehi et al. | 392/418 |
| 6,200,634 B1 | * | 3/2001 | Johnsgard et al. | 427/248.1 |
| 6,350,964 B1 | * | 2/2002 | Boas et al. | 219/390 |
| 6,376,804 B1 | * | 4/2002 | Ranish et al. | 219/390 |

(Continued)

FOREIGN PATENT DOCUMENTS

| | | |
|---|---|---|
| JP | 2002075901 | 3/2002 |
| JP | 2003022982 | 1/2003 |

(Continued)

*Primary Examiner* — David Angwin
*Assistant Examiner* — Jimmy Chou
(74) *Attorney, Agent, or Firm* — Slater Matsil, LLP

(57) ABSTRACT

A honeycomb heater includes a lamp housing having an outer edge that forms a partial circle. The lamp housing has an opening extending from a top surface to a bottom surface of the lamp housing. The opening further extends from the outer edge into a center region of the lamp housing. A plurality of lamps is distributed throughout the lamp housing, and is configured to emit light out of the top surface of the lamp housing.

20 Claims, 8 Drawing Sheets

(56) References Cited

U.S. PATENT DOCUMENTS

| | | | |
|---|---|---|---|
| 6,414,279 B1* | 7/2002 | Suzuki et al. | 219/405 |
| 6,472,639 B2* | 10/2002 | Nishitani et al. | 219/390 |
| 6,518,547 B2* | 2/2003 | Takahashi et al. | 219/390 |
| 6,800,833 B2* | 10/2004 | Gregor et al. | 219/390 |
| 6,818,864 B2* | 11/2004 | Ptak | 219/390 |
| 6,835,914 B2* | 12/2004 | Timans | 219/390 |
| 6,889,004 B2* | 5/2005 | Li | 392/418 |
| 6,891,131 B2* | 5/2005 | Sakuma et al. | 219/390 |
| 6,893,507 B2* | 5/2005 | Goodman et al. | 118/725 |
| 7,112,763 B2* | 9/2006 | Hunter et al. | 219/411 |
| 7,262,390 B2* | 8/2007 | Su et al. | 219/390 |
| 7,378,618 B1* | 5/2008 | Sorabji et al. | 219/411 |
| 7,509,035 B2* | 3/2009 | Ranish et al. | 392/416 |
| 7,812,286 B2* | 10/2010 | Sorabji et al. | 219/390 |
| 7,910,862 B2* | 3/2011 | Yoshie | 219/460.1 |
| 7,972,441 B2* | 7/2011 | Yokota et al. | 118/715 |
| 8,107,801 B2* | 1/2012 | Shimizu et al. | 392/418 |
| 8,222,574 B2* | 7/2012 | Sorabji et al. | 219/444.1 |
| 8,227,729 B2* | 7/2012 | Sorabji et al. | 219/411 |
| 8,254,767 B2* | 8/2012 | Hunter et al. | 392/416 |
| 8,314,371 B2* | 11/2012 | Sorabji et al. | 219/446.1 |
| 8,567,983 B2* | 10/2013 | Boyer et al. | 362/153.1 |
| 8,610,033 B1* | 12/2013 | Moore et al. | 219/390 |
| 8,658,947 B2* | 2/2014 | Sorabji et al. | 219/411 |
| 8,724,977 B2* | 5/2014 | Aderhold et al. | 392/416 |
| 2003/0183611 A1* | 10/2003 | Gregor et al. | 219/390 |
| 2004/0026400 A1* | 2/2004 | Ptak | 219/390 |
| 2004/0084437 A1* | 5/2004 | Timans | 219/390 |
| 2005/0013137 A1* | 1/2005 | Burton, Jr. | F21V 21/0824 362/431 |
| 2005/0077280 A1* | 4/2005 | Ptak | 219/390 |
| 2005/0173403 A1* | 8/2005 | Benjamin et al. | 219/444.1 |
| 2005/0173404 A1* | 8/2005 | Benjamin et al. | 219/444.1 |
| 2006/0086713 A1* | 4/2006 | Hunter et al. | 219/411 |
| 2006/0291834 A1* | 12/2006 | Hauf et al. | 392/416 |
| 2008/0187299 A1* | 8/2008 | Shimizu et al. | 392/418 |
| 2008/0226272 A1* | 9/2008 | Kasai et al. | 392/418 |
| 2009/0087932 A1* | 4/2009 | Kondoh | H01L 21/67196 438/30 |
| 2009/0098742 A1* | 4/2009 | Timans | 438/795 |
| 2010/0054720 A1* | 3/2010 | Hunter et al. | 392/416 |
| 2011/0042119 A1* | 2/2011 | Battis | H01S 3/0931 174/50 |
| 2012/0111838 A1* | 5/2012 | Zafiropoulo et al. | 219/121.65 |
| 2012/0291696 A1* | 11/2012 | Clarke | 117/88 |
| 2012/0328273 A1* | 12/2012 | Kawano et al. | 392/418 |

FOREIGN PATENT DOCUMENTS

| | | |
|---|---|---|
| KR | 1020060133808 | 12/2006 |
| KR | 1020090128207 | 12/2009 |

* cited by examiner

HONEYCOMB HEATERS FOR INTEGRATED CIRCUIT MANUFACTURING

BACKGROUND

Honeycomb heaters are used in the integrated circuit manufacturing processes. In some of the integrated circuit manufacturing processes, the honeycomb heaters are used to heat the backsides of the wafers. A wafer that is heated by a honeycomb heater is supported by a susceptor, which is further supported by a shaft at the center or a hollow cylinder at the edge. The susceptor, its support, and the wafer rotate during the integrated circuit manufacturing process.

The honeycomb heater is underlying, and aligned to the susceptor. If the shaft needs to penetrate through the honeycomb heater, no lamp is distributed in the center region of the honeycomb heater. This causes the center cold problem, wherein the center region of the wafer is colder than some other regions of the wafer.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Backside wafer heating apparatuses that include honeycomb heaters are provided in accordance with various exemplary embodiments. The variations and the operation of the embodiments are discussed. Throughout the various views and illustrative embodiments, like reference numbers are used to designate like elements.

Figure 1:
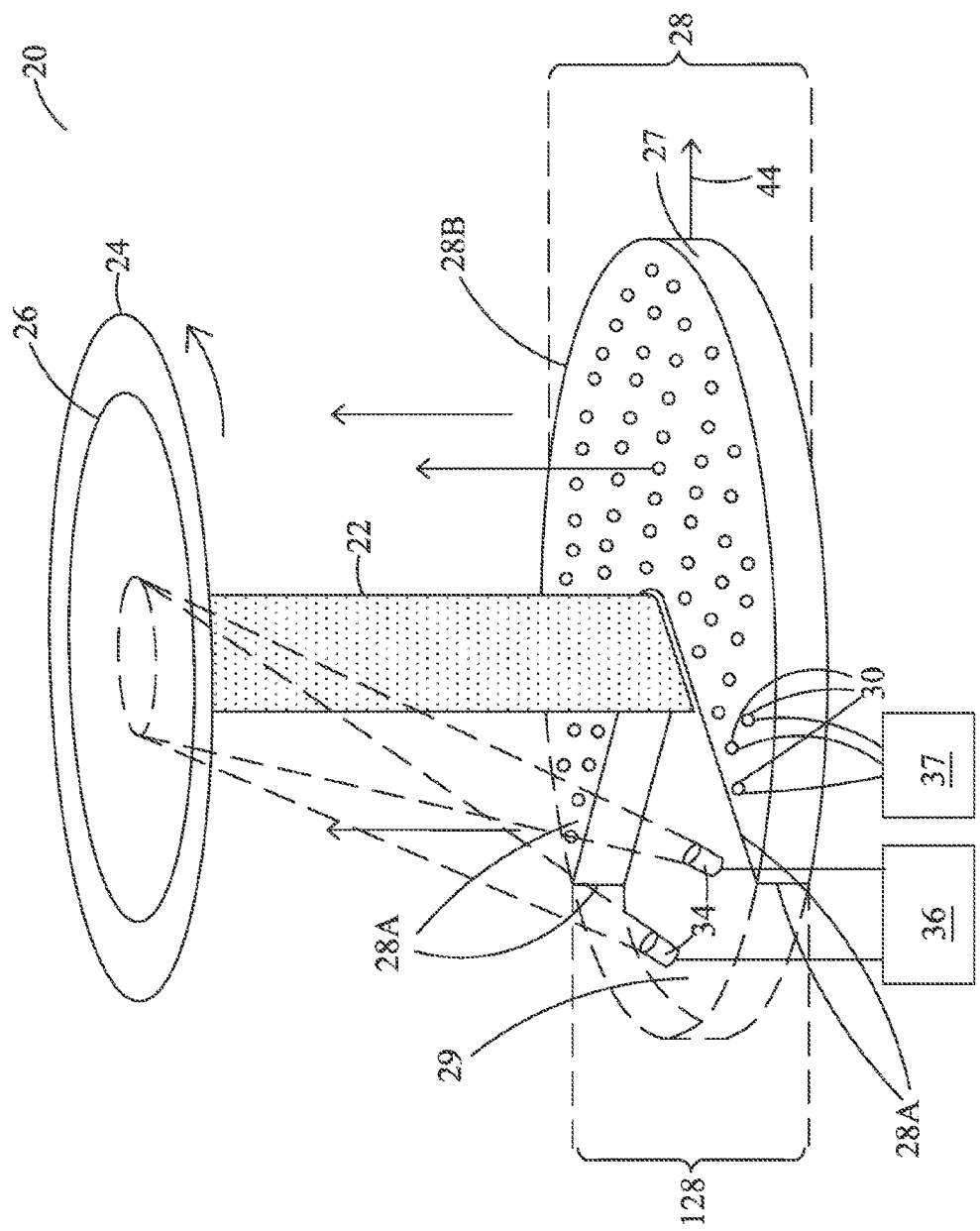
FIG. 1 is a perspective view of an apparatus in accordance with some exemplary embodiments, wherein the apparatus includes a honecomb heater having an opening therein.

FIG. 1 illustrates a perspective view of apparatus 20 for the backside heating of wafers in accordance with some exemplary embodiments. Apparatus 20 includes shaft 22, and susceptor 24 over and connected to shaft 22. Shaft 22 is joined to the center portion of the susceptor 24. Wafer 26 is placed over susceptor 24. Wafer 26 may be a semiconductor wafer such as a silicon wafer, on which integrated circuit devices such as transistors may be formed. In some embodiments, susceptor 24 has a size larger than the size of wafer 26. Susceptor 24 may comprise silicon carbide in some exemplary embodiments. Shaft 22 is configured to rotate along its axis. As a result, susceptor 24 and wafer 26 rotate along with shaft 22.

Honeycomb heater 28 is placed underlying susceptor 24. Honeycomb heater 28 includes lamp housing 27, and lamps 30 disposed in lamp housing 27. Shaft 22 penetrates through a center region of lamp housing 27. Lamps 30 may be distributed throughout lamp housing 27. Lamps 30 faces toward susceptor 24 and wafer 26, so that in the integrated manufacturing process, lamps 30 may emit light upwardly to heat wafer 26. Honeycomb heater 28 remains still during the manufacturing process performed on wafer, while wafer 26 rotates.

Lamp housing 27 may have a round top view (also refer to FIGS. 2 and 3), except portion 128 of the respective circle is removed. Honeycomb heater 28 thus may have a partial circular top-view shape, and the outer edge 28B of lamp housing 27 forms a partial circle. Throughout the description, the region that portion 128 would otherwise occupy is referred to as opening 29. Accordingly, no lamp is disposed in opening 29. In some embodiments, honeycomb heater 28, due to the removal of portion 128, have edges 28A that extend from the center region of lamp housing 27 to outer edge 28B. The center region of lamp housing 27 is also removed, so that shaft 22 may penetrate through. In some embodiments, opening 29 extends from the outer edge 28B of lamp housing 27 to the center region of lamp housing 27, and extends from the top surface to the bottom surface of lamp housing 27.

Figure 2:
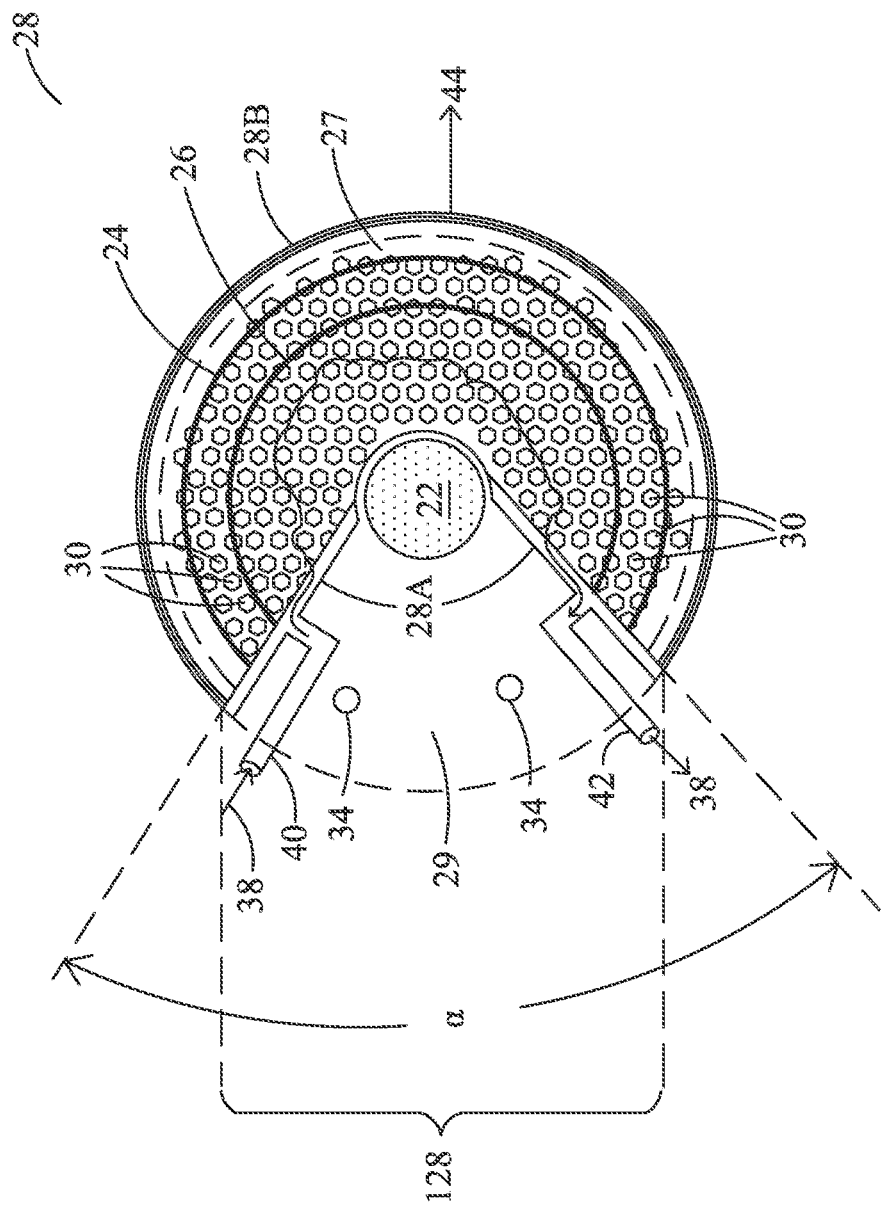
FIGS. 2 and 3 are top views of the apparatus in accordance with various exemplary embodiments.
Figure 3:
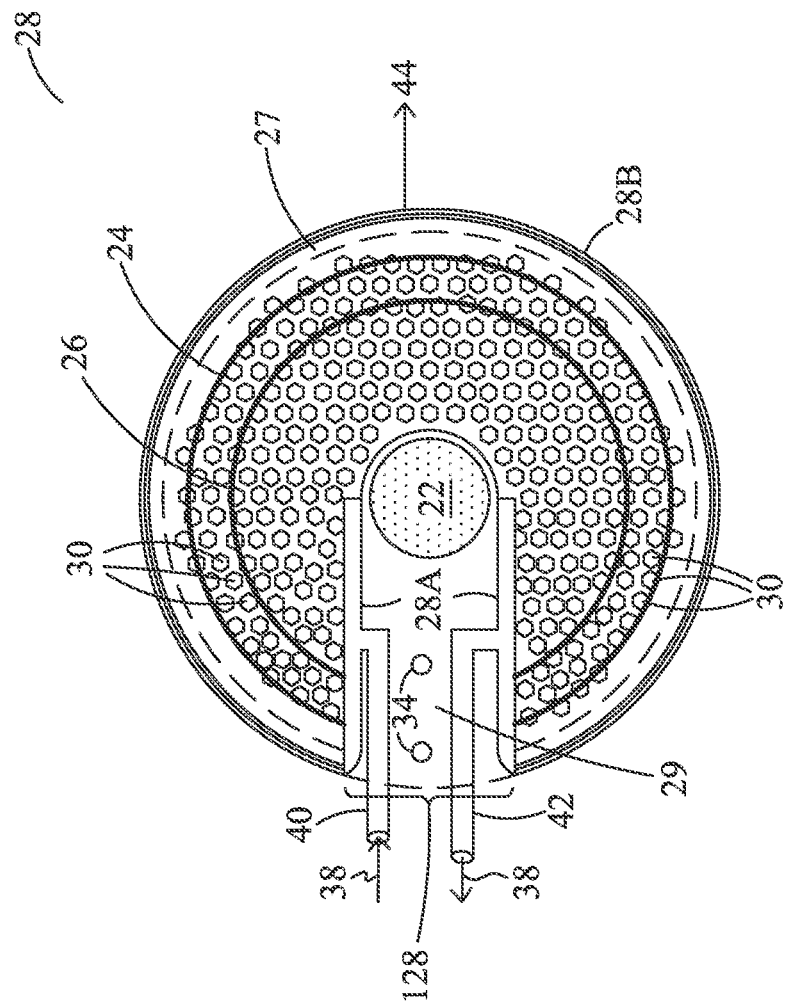

FIG. 2 illustrates a top view of honeycomb heater 28 in accordance with some exemplary embodiments. Edges 28A (which face opening 29) of lamp housing 27 may be substantially straight, although they may also be curved. Angle $\alpha$ between edges 28A may range between about 10 degrees and about 135 degrees, or between about 45 degrees and about 135 degrees in some exemplary embodiments. In alternative embodiments, as shown in FIG. 3, which is also a top view of honeycomb heater 28, edges 28A may be substantially parallel to each other. Regardless of the top-view shape of opening 29, opening 29 may occupy between about 1/8 and about 3/8 of the otherwise full circle of lamp housing 27, wherein the full circle is defined by outer edge 28B.

In some embodiments, apparatus 20 as in FIG. 1 is used for an epitaxy process, wherein a semiconductor material such as silicon, silicon germanium, or the like is epitaxially grown on wafer 26. In other embodiments, other integrated circuit manufacturing processes including deposition and surface treatment steps, during which wafer 26 may be heated from the backside, may also be performed using apparatus 20. Apparatus 20 may be placed in a chamber (not shown), which may be vacuumed. During the integrated circuit manufacturing process, since wafer 26 rotates along with shaft 22 and susceptor 24, the removal of portion 128 of honeycomb heater 28 does not cause the non-uniformity in the heating of wafer 26.

Referring again to FIG. 1, one or a plurality of spot lamps 34 is placed adjacent to honeycomb heater 28. In some embodiments, spot lamps 34 are disposed in opening 29. Each of spot lamps 34 is configured to focus on the center region of wafer 26, and hence the center region of wafer 26 receives more heating from spot lamps 34 than the middle and edge portions of wafer 26. Since shaft 22 needs to penetrate through honeycomb heater 28, lamps 30 cannot be distributed to the center region of lamp housing 27. This may cause the center region of wafer 26 to have temperatures lower than some other portions of wafer 26. In accordance with the embodiments, however, the heat provided by spot lamps 34 compensates for, at least partially, the reduction in the heat provided to the center of wafer 26. The temperatures throughout wafer 26 are thus more uniform.

Spot lamps 34 may be connected to and power by power source 36. Lamps 30 may be connected to and power by power source 37. In some embodiments, power sources 36 and 37 are separate power sources. The power provided to spot lamps 34 and the power provided to lamps 30 may thus be adjusted separately, so that the heat compensation to the center of wafer 26 may be adjusted accurately.

Referring to FIG. 1, with opening 29 connected to the center region of lamp housing 27, and with shaft 22 penetrating through the center region of lamp housing 27, honeycomb heater 28 may slide out without the need to remove shaft 22 and susceptor 24 first. The sliding direction of honeycomb heater 28 is illustrated by arrow 44 in FIGS. 1 through 3. The maintenance (such as replacing failed lamps 30) of honeycomb heater 28 is hence easier.

During the operation of lamps 30, lamps 30 may need to be cooled to prevent the overheating of lamps 30 and honeycomb heater 28. Referring to FIGS. 2 and 3, due to the existence of opening 29, pipes 40 and 40 may be connected to edges 28A of lamp housing 27. Pipes 40 and 42 are connected to the spaces between lamps 30 that have cylinder shapes. Pipes 40 and 42 may be used as the inlet and the outlet of coolant 38, which may be oil, water, cold air, or the like. As shown in FIGS. 2 and 3, coolant 38 may flow into pipe 40 (or 42), and out of pipe 42 (or 40). Inside lamp housing 27, coolant 38 flows through the spaces between lamps 30 in a clockwise direction or a counter-clockwise direction, depending on which of pipes 40 and 42 is used as the inlet or the outlet. An exemplary flowing direction is illustrated as curved line 45, which passes through the spaces between lamps 30. Coolant 38 brings out the heat in honeycomb heater 28, so that honeycomb heater 28 is cooled. The clockwise or the counter-clockwise flow of coolant 38 results in the improvement in the efficiency of cooling.

FIGS. 4A through 7 illustrate honeycomb heaters 28 in accordance with alternative exemplary embodiments. Unless specified otherwise, the materials and the design of the components in these embodiments are essentially the same as the like components, which are denoted by like reference numerals in the embodiments shown in FIGS. 1 through 3. The details of the embodiments shown in FIGS. 4 through 7 may thus be found in the discussion of the like embodiments shown in FIGS. 1 through 3.

Figure 4A:
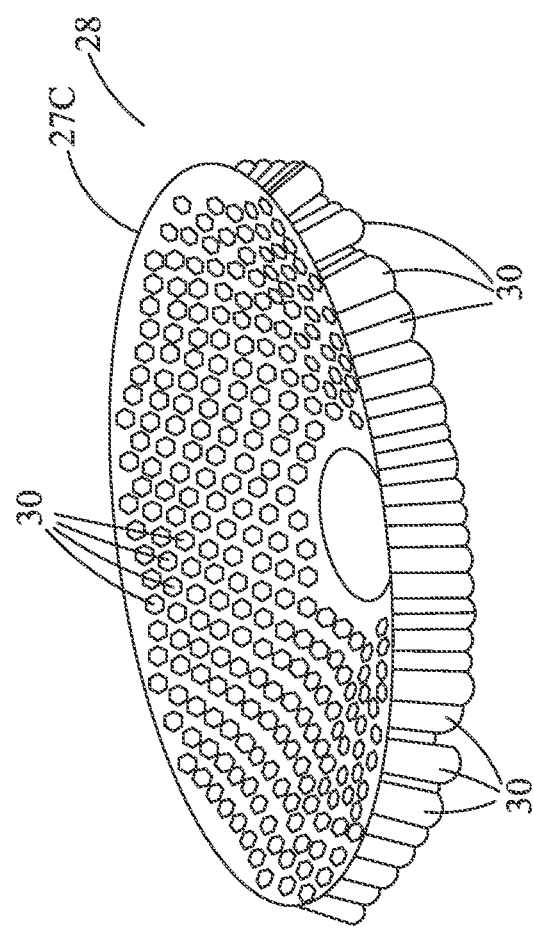
FIGS. 4A through 7 are perspective views and a cross-sectional view of various honeycomb heaters in accordance with some exemplary embodiments.
Figure 4B:
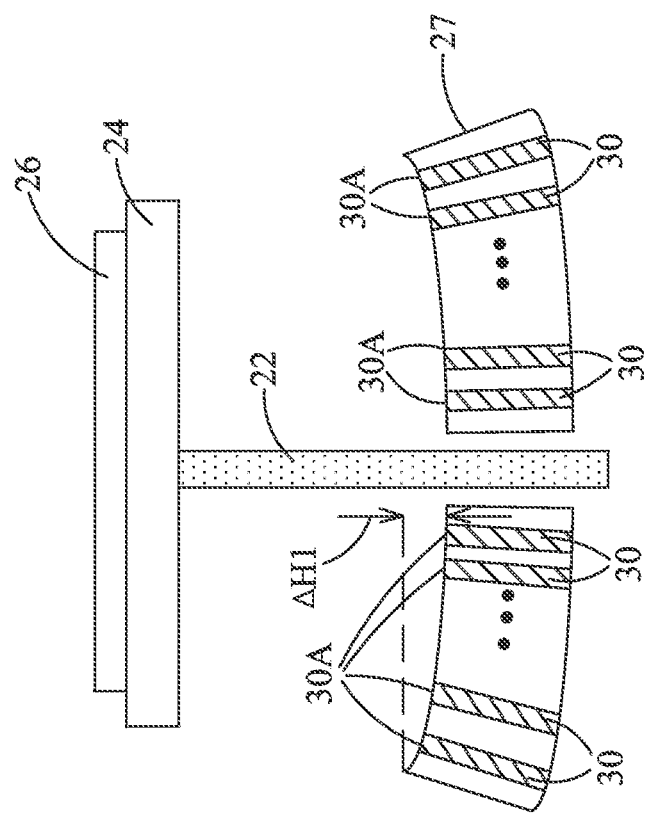
Figure 5:
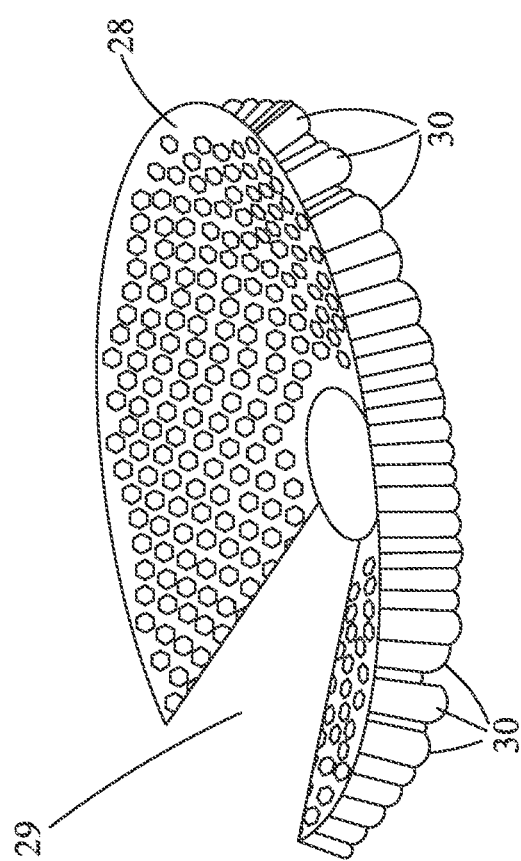

Referring to FIG. 4A, honeycomb heater 28 has a non-coplanar top surface 27C, which is also the top surface of lamp housing 27. Lamps 30 are disposed following the profile of top surface 27C. Accordingly, the top surfaces of lamps 30 are also non-coplanar. FIG. 4B illustrates a cross-sectional view of honeycomb heater 28 as shown in FIG. 4A. Since top surface 27C is non-planar, the top ends 30A of lamps 30 are also non-coplanar, wherein the light/heat is emitted from top ends 30A. From the center to the edge, top surface 27C may be increasingly higher. The increase in the height of top surface 27C from the center to the edge may be gradual and substantially continuous. As shown in FIG. 4B, since the edge portions of honeycomb heater 28 are higher than the center portions, the edge portions may be closer to the overlying wafer 26 than the honeycomb heaters having planar top surfaces. Accordingly, the heating to wafer 26 by lamps 30 may be more uniform. In some exemplary embodiments, height difference $\Delta H1$, which is the height difference between the edge portions and the center portion of top surface 27C, is greater than about 20 mm, for example. FIG. 5 illustrates an embodiment essentially the same as in FIGS. 4A and 4B, except that opening 29 is formed in honeycomb heater 28. The details of opening 29 are essentially the same as discussed in the embodiments in FIGS. 1 through 3, and hence are not discussed herein.

Figure 6:
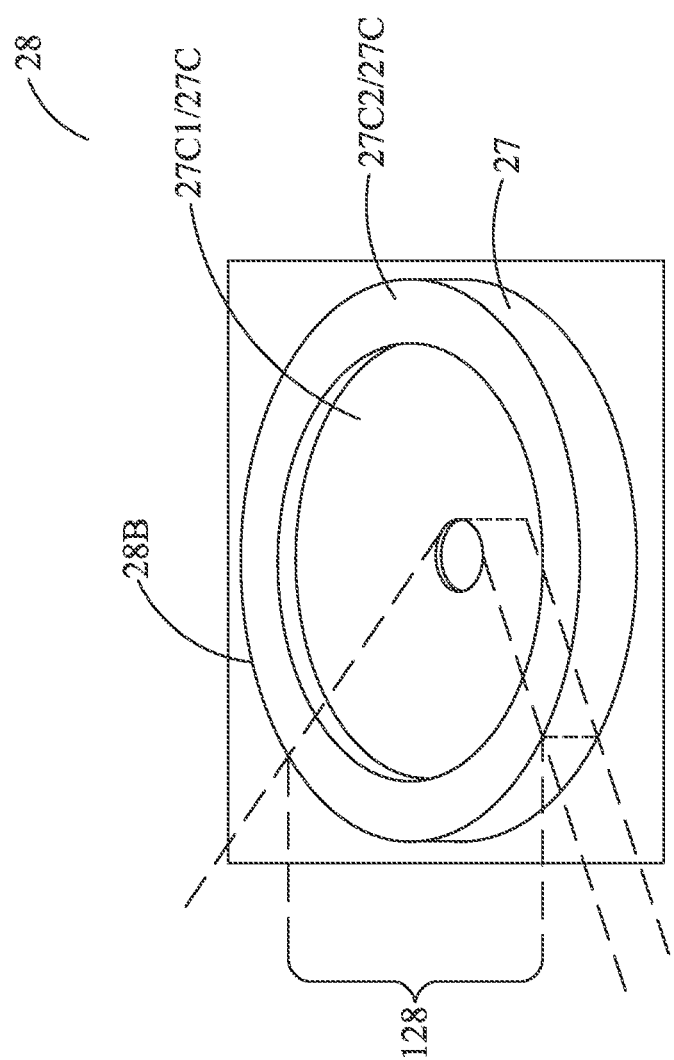

FIG. 6 illustrates honeycomb heater 28 in accordance with alternative exemplary embodiments. Top surface 27C of honeycomb heater 28 includes curved top surface portion 27C1 and planar top surface portion 27C2. Top surface portion 27C2 may be parallel to the overlying susceptor 24 and wafer 26 (not shown in FIG. 6, please refer to FIG. 4B) in some embodiments. Top surface portion 27C2 may form a ring encircling the curved top surface portion 27C1 in some embodiments. Top surface portion 27C2 may be used to compensate for the reduced heating to the edge of the overlying wafer 26. In some embodiments, portion 128 of honeycomb heater 28 may be removed to form an opening, which is similar to opening 29 in FIG. 1. In alternative embodiments, portion 128 is not removed, and outer edge 28B of honeycomb heater 28 may form a full circle with no break therein.

Figure 7:
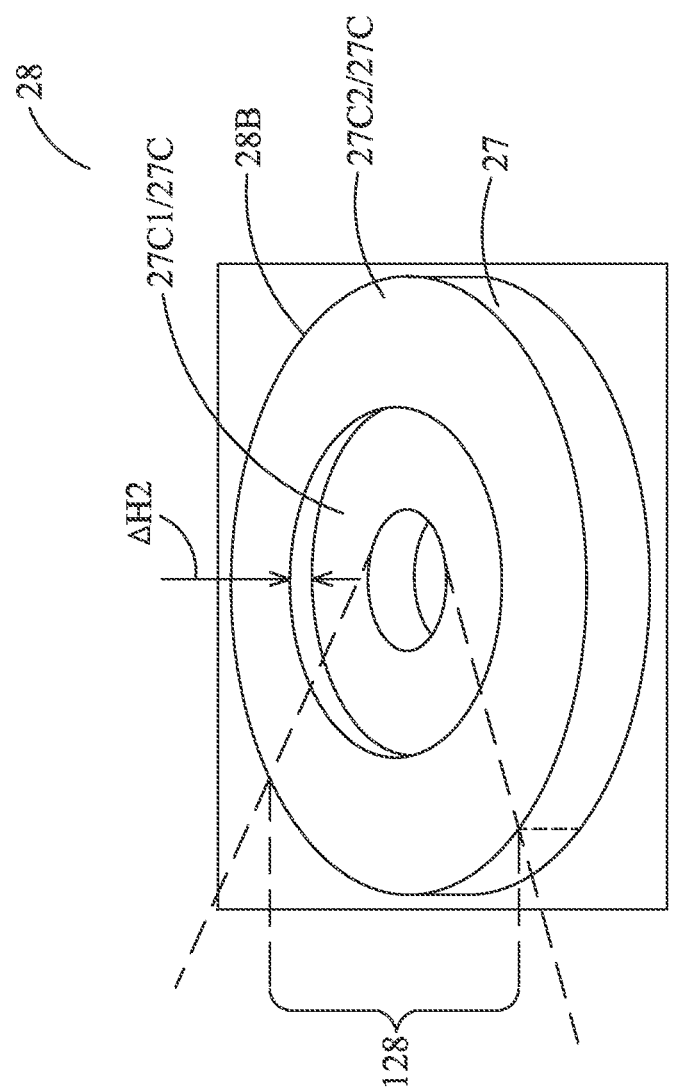

FIG. 7 illustrates honeycomb heater 28 in accordance with yet alternative exemplary embodiments. Top surface 27C of honeycomb heater 28 may include a plurality of planar top portions, for example, 27C1, 27C2, and/or the like. Top surface portions 27C1, 27C2, and the like form steps. In some exemplary embodiments, step height $\Delta H2$ is greater than about 50 mm. In some embodiments, portion 128 of honeycomb heater 28 may be removed to form an opening. In alternative embodiments, portion 128 is not removed, and edge 28B of honeycomb heater 28 may form a full circle with no break therein.

It is realized that the embodiments shown in FIGS. 4A through 7 may include other components that are shown in FIGS. 1 through 3, such as spot lamps 34, pipes 40 and 42, power sources 36 and 37, shaft 22, susceptor 24, wafer 26, and the like. The details of these components may also be essentially the same as in the embodiments in FIGS. 1 through 3.

In the embodiments, by forming honeycomb heaters with openings therein, the maintenance of the honeycomb heaters are easier. Furthermore, by forming the honeycomb heaters having non-coplanar top surfaces and/or adding spot lamps, the non-uniformity in the wafer heating is reduced.

In accordance with embodiments, a honeycomb heater includes a lamp housing having an outer edge that forms a partial circle. The lamp housing has an opening extending from a top surface to a bottom surface of the lamp housing. The opening further extends from the outer edge into a center region of the lamp housing. A plurality of lamps is distributed throughout the lamp housing, and is configured to emit light out of the top surface of the lamp housing.

In accordance with other embodiments, an apparatus includes a honeycomb heater. The honeycomb heater includes a lamp housing having an outer edge, wherein the outer edge forms a partial circle. The lamp housing has an opening extending from a top surface to a bottom surface of the lamp housing, wherein the opening further extends from the outer edge into a center region of lamp housing. The lamp housing has a first edge and a second edge facing the opening, wherein each of the first edge and the second edge extends from the top surface to the bottom surface of the lamp housing, and extends from the outer edge to the center region of the circle. A plurality of lamps is distributed throughout the lamp housing. A shaft penetrates through the center region of the lamp housing. A susceptor is over and joined to the shaft, wherein the shaft and the susceptor are configured to rotate along an axis of the shaft.

In accordance with yet other embodiments, an apparatus includes a honeycomb heater. The honeycomb heater has a lamp housing that has a top surface and a bottom surface, wherein the top surface has a first portion farther away from a center region of the lamp housing than a second portion of the top surface, and wherein the first portion and the second portion are non-coplanar. A plurality of lamps is distributed throughout the lamp housing. A shaft penetrates through the center region of the lamp housing. A susceptor is over the shaft and the lamp housing, wherein the shaft and the susceptor are joined to each other.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An apparatus comprising:
   a honeycomb heater apparatus comprising:
      a lamp housing shaped as a partial disk, the lamp housing having an opening extending from a top surface to a bottom surface of the lamp housing, the opening also extending from a center portion of the lamp housing to an outermost edge of the lamp housing, in a top view of the lamp housing, the outermost edge of the lamp housing forming a partial circle that is discontinuous at the opening; and
      a plurality of lamps distributed throughout the lamp housing;
   a shaft penetrating through the opening of the lamp housing, with the shaft comprising a first portion higher than the lamp housing, a second portion at a same level as the lamp housing, and a third portion lower than the lamp housing, wherein the opening has a shape and a size allowing the lamp housing and the shaft to slide relative to each other;
   a wafer susceptor over the shaft, with a top end of the shaft connected to a center portion of a bottom surface of the wafer susceptor, wherein the plurality of lamps has a light projecting direction toward the bottom surface of the wafer susceptor; and
   a spot lamp disposed in the opening of the lamp housing.

2. The apparatus of claim 1, wherein the partial disk further comprises:
   an inner edge, with each of the inner edge and the outer edge forming a partial circle;
   a first edge connecting a first end of the inner edge to a first end of the outer edge; and
   a second edge connecting a second end of the inner edge to a second end of the outer edge, wherein the opening comprises a first portion between the first edge and the second edge, and a second portion inside a region defined by the inner edge.

3. The apparatus of claim 1, wherein the spot lamp is configured to provide more heat to one region than to remaining regions of a wafer placed on the wafer susceptor, the spot lamp electrically coupled to a first power supply different from a second power supply electrically coupled to the plurality of lamps.

4. The apparatus of claim 1, wherein the lamp housing comprises:
   a first edge and a second edge facing the opening;
   a first pipe connected to spaces between the plurality of lamps through the first edge; and
   a second pipe connected to the spaces through the second edge, wherein the first and the second pipes are configured to conduct a coolant to flow through the spaces.

5. The apparatus of claim 1, wherein the lamp housing comprises a first edge and a second edge facing the opening, wherein the first and the second edges form an angle between about 45 degrees and about 135 degrees.

6. The apparatus of claim 1, wherein the top surface of the lamp housing is a flat top surface.

7. The apparatus of claim 6, wherein first portions of the top surface of the lamp housing are higher than second portions of the top surface, and wherein the first portions of the top surface are closer to an outer edge of the lamp housing than the second portions.

8. An apparatus comprising:
   a honeycomb heater apparatus comprising:
      a lamp housing comprising a shape of a partial disk in a top view, the partial disk having an opening extending from a top surface to a bottom surface of the lamp housing, with the partial disk comprising:
         in a top view, an inner edge and an outer edge, with the inner edge forming a majority of a first incomplete circle and the outer edge forming a majority of a second incomplete circle;
         in a top view, a first straight edge connecting a first end of the inner edge to a first end of the outer edge; and
         in a top view, a second straight edge connecting a second end of the inner edge to a second end of the outer edge, with each of the first straight edge and the second straight edge extending from the top surface to the bottom surface of the lamp housing, wherein the opening further extending in an angular direction between the first straight edge and the second straight edge and in a radial direction between the inner edge and the outer edge;
      a plurality of lamps distributed throughout the lamp housing;
   a shaft penetrating through the opening of the lamp housing, wherein a circumference of the shaft, the inner edge, and the outer edge are concentric to a central axis, wherein the opening has a shape and a size allowing the lamp housing and the shaft to slide relative to each other, the shaft having a first position through the opening and a second position out of the lamp housing, allowing the slide relative to each other directly in a linear direction that is parallel to a largest plane of the lamp housing; and
   a susceptor over and joined to the shaft, wherein the shaft and the susceptor are configured to rotate along an axis of the shaft.

9. The apparatus of claim 8, wherein the first straight edge and the second straight edge form an angle between about 45 degrees and about 135 degrees.

10. The apparatus of claim 8, wherein the opening occupies between about one eighth and about three eighths of an area of a full circle defined by the outer edge.

11. The apparatus of claim 8, wherein the lamp housing is configured to slide relative to the shaft in a direction perpendicular to a lengthwise direction of the shaft, and wherein the shaft is configured to pass through the opening when the lamp housing slides.

12. The apparatus of claim 8 further comprising a spot lamp disposed in the opening, wherein the spot lamp is configured to provide more heat to a center region than to remaining regions of a wafer placed on the susceptor.

13. The apparatus of claim 8, wherein the top surface of the lamp housing is non-coplanar, and wherein outer portions of the lamp housing are higher than inner portions of the lamp housing.

14. An apparatus comprising:
a honeycomb heater apparatus comprising:
  a lamp housing having a partial disk shape, in a top view the partial disk shape being a circular sector of greater than 180 degrees, the lamp housing comprising a top surface and a bottom surface, wherein the top surface comprises a first portion closer to a center region of the lamp housing than a second portion of the top surface, and wherein the first portion and the second portion are in different planes; and
  a plurality of lamps distributed throughout the lamp housing;
a shaft penetrating through an opening of the lamp housing, wherein the opening has a shape and a size allowing the lamp housing and the shaft to slide relative to each other from a first position directly to a second position in a straight path directly connecting the first position to the second position, wherein the straight path extends in a direction perpendicular to a lengthwise direction of the shaft, wherein at the first position, the shaft penetrates through a center portion of the lamp housing, and at the second position, the shaft is outside of the lamp housing; and
a susceptor over the shaft and the lamp housing, wherein the shaft and the susceptor are joined to each other.

15. The apparatus of claim 14, wherein the second portion of the top surface of the lamp housing is higher than the first portion of the top surface of the lamp housing.

16. The apparatus of claim 14, wherein each of the first portion and the second portion of the top surface of the lamp housing is a flat surface, and wherein the first portion and the second portion form a step.

17. The apparatus of claim 14, wherein the first portion gradually rises in heights in a direction from the center region to an outer edge of the lamp housing, and wherein the second portion is a flat surface.

18. The apparatus of claim 14, wherein the lamp housing comprises:
an outer edge forming a partial ring, wherein the lamp housing comprises an opening extending from a top surface to a bottom surface of the lamp housing, and wherein the opening further extends from the outer edge to the center region of the lamp housing; and
a first edge and a second edge facing the opening, wherein each of the first edge and the second edge extends from the top surface to the bottom surface of the lamp housing, and extends from the outer edge to the center region of the lamp housing.

19. The apparatus of claim 14, wherein a linear length between the first position and the second position is parallel to a largest plane of the lamp housing.

20. The apparatus of claim 7, wherein the shaft comprises a first end portion higher than the lamp housing, a second end portion lower the lamp housing, and a middle portion at a same level as the lamp housing, and the middle portion is between the first end portion and the second end portion.

* * * * *